United States Patent
Boyd, Jr. et al.

(10) Patent No.: US 10,020,218 B2
(45) Date of Patent: Jul. 10, 2018

(54) SUBSTRATE SUPPORT ASSEMBLY WITH DEPOSITED SURFACE FEATURES

(71) Applicant: Applied Materials, Inc., Santa Clara, CA (US)

(72) Inventors: Wendell Glenn Boyd, Jr., Morgan Hill, CA (US); Vijay D. Parkhe, San Jose, CA (US); Teng-Fang Kuo, Santa Clara, CA (US); Zhenwen Ding, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 14/944,018

(22) Filed: Nov. 17, 2015

(65) Prior Publication Data

US 2017/0140970 A1    May 18, 2017

(51) Int. Cl.
*H01T 23/00* (2006.01)
*H01L 21/683* (2006.01)
*C03C 17/00* (2006.01)
*H01L 21/687* (2006.01)

(52) U.S. Cl.
CPC .......... *H01L 21/6833* (2013.01); *C03C 17/00* (2013.01); *H01L 21/6875* (2013.01); *H01L 21/68757* (2013.01)

(58) Field of Classification Search
USPC ................................................ 361/234, 230
See application file for complete search history.

(56) References Cited

U.S. PATENT DOCUMENTS

| 4,439,248 A | 3/1984 | Herchenroeder et al. |
| 4,725,566 A | 2/1988 | Pham Ngu et al. |
| 5,034,688 A | 7/1991 | Moulene |
| 5,108,025 A | 4/1992 | Kang |
| 5,113,472 A | 5/1992 | Gualtieri et al. |
| 5,381,944 A | 1/1995 | Makowiecki et al. |
| 5,548,470 A | 8/1996 | Husain et al. |

(Continued)

FOREIGN PATENT DOCUMENTS

| CN | 101131917 A | 2/2008 |
| DE | 10224137 A1 | 12/2003 |

(Continued)

OTHER PUBLICATIONS

International Search Report and Written Opinion for PCT Application No. PCT/US2016/035306 dated Aug. 24, 2016.

(Continued)

*Primary Examiner* — Danny Nguyen
(74) *Attorney, Agent, or Firm* — Lowenstein Sandler LLP

(57) ABSTRACT

A method of manufacturing an electrostatic chuck includes polishing a surface of a ceramic body of the electrostatic chuck to produce a polished surface and depositing a ceramic coating onto the polished surface of the ceramic body to produce a coated ceramic body. The method further includes disposing a mask over the coated ceramic coating, the mask comprising a plurality of elliptical holes and depositing a ceramic material through the plurality of elliptical holes of the mask to form a plurality of elliptical mesas on the coated ceramic body, wherein the plurality of elliptical mesas have rounded edges. The mask is then removed from the coated ceramic body and the plurality of elliptical mesas are polished.

19 Claims, 7 Drawing Sheets

(56) References Cited

U.S. PATENT DOCUMENTS

| | | |
|---|---|---|
| 5,631,803 A | 5/1997 | Cameron et al. |
| 5,680,013 A | 10/1997 | Dornfest et al. |
| 5,800,871 A | 9/1998 | Collins et al. |
| 5,886,863 A | 3/1999 | Nagasaki |
| 5,903,428 A | 5/1999 | Grimard et al. |
| 5,916,689 A | 6/1999 | Collins et al. |
| 6,063,203 A | 5/2000 | Satoh |
| 6,194,083 B1 | 2/2001 | Yasuda et al. |
| 6,245,202 B1 | 6/2001 | Edamura et al. |
| 6,361,645 B1 | 3/2002 | Schoepp et al. |
| 6,444,957 B1 | 9/2002 | Kitagawa |
| 6,500,265 B1 | 12/2002 | Shang et al. |
| 6,506,254 B1 | 1/2003 | Bosch et al. |
| 6,508,884 B2 | 1/2003 | Kuibira |
| 6,534,194 B2 | 3/2003 | Weihs et al. |
| 6,581,275 B2 | 6/2003 | Narendrnath et al. |
| 6,616,031 B2 | 9/2003 | Wong et al. |
| 6,641,697 B2 | 11/2003 | Han et al. |
| 6,682,820 B1 | 1/2004 | Pujari |
| 6,780,787 B2 | 8/2004 | O'Donnell |
| 6,805,952 B2 | 10/2004 | Chang et al. |
| 6,847,516 B2 | 1/2005 | Kwon et al. |
| 6,921,881 B2 | 7/2005 | Ito et al. |
| 6,933,254 B2 | 8/2005 | Morita et al. |
| 6,942,929 B2 | 9/2005 | Han et al. |
| 7,434,676 B2 | 10/2008 | Brill et al. |
| 7,441,688 B2 | 10/2008 | Van Heerden et al. |
| 7,517,617 B2 | 4/2009 | Aschke et al. |
| 7,586,734 B2 | 9/2009 | Kamitani et al. |
| 7,615,133 B2 | 11/2009 | Tateno et al. |
| 7,649,729 B2 | 1/2010 | Buchberger, Jr. et al. |
| 7,690,308 B2 | 4/2010 | Nielson et al. |
| 7,696,117 B2 | 4/2010 | Sun et al. |
| 7,718,007 B2 | 5/2010 | Oohashi et al. |
| 7,810,704 B2 | 10/2010 | Duckham et al. |
| 7,824,498 B2 | 11/2010 | Parkhe et al. |
| 7,964,517 B2 | 6/2011 | Jaiswal |
| 8,034,734 B2 | 10/2011 | Sun et al. |
| 8,075,729 B2 | 12/2011 | Holland et al. |
| 8,206,829 B2 | 6/2012 | Sun et al. |
| 8,390,980 B2 | 3/2013 | Sansoni et al. |
| 8,404,572 B2 | 3/2013 | Chang et al. |
| 8,829,397 B2 | 9/2014 | Kano |
| 8,852,348 B2 | 10/2014 | Parkhe et al. |
| 8,941,969 B2 | 1/2015 | Thach et al. |
| 2002/0129904 A1 | 9/2002 | Itabashi et al. |
| 2002/0134511 A1* | 9/2002 | Ushioda ............ C23C 16/4581 156/345.51 |
| 2002/0177001 A1 | 11/2002 | Harada et al. |
| 2003/0007308 A1 | 1/2003 | Harada et al. |
| 2003/0029563 A1 | 2/2003 | Kaushal et al. |
| 2003/0047802 A1 | 3/2003 | Hiramatsu et al. |
| 2003/0161088 A1 | 8/2003 | Migita |
| 2003/0170415 A1 | 9/2003 | Hiramatsu et al. |
| 2004/0002221 A1 | 1/2004 | O'Donnell et al. |
| 2004/0055709 A1 | 3/2004 | Boyd, Jr. |
| 2004/0065259 A1 | 4/2004 | Inazumachi et al. |
| 2004/0117977 A1 | 6/2004 | Hiramatsu et al. |
| 2004/0187787 A1 | 9/2004 | Dawson et al. |
| 2004/0048461 A1 | 11/2004 | Chen et al. |
| 2004/0240142 A1 | 12/2004 | Fujii et al. |
| 2005/0016684 A1 | 1/2005 | Sun et al. |
| 2005/0037193 A1 | 2/2005 | Sun et al. |
| 2005/0041364 A1 | 2/2005 | Kellerman et al. |
| 2005/0045106 A1 | 3/2005 | Boyd, Jr. et al. |
| 2005/0056218 A1 | 3/2005 | Sun et al. |
| 2005/0215073 A1 | 9/2005 | Nakamura et al. |
| 2005/0266682 A1 | 12/2005 | Chen et al. |
| 2006/0002053 A1 | 1/2006 | Brown et al. |
| 2006/0110624 A1* | 5/2006 | Hattori .................. B32B 18/00 428/698 |
| 2006/0164785 A1 | 7/2006 | Pellegrin |
| 2007/0047170 A1 | 3/2007 | Sun et al. |
| 2007/0212567 A1 | 9/2007 | Esaki et al. |
| 2008/0016684 A1 | 1/2008 | Olechnowicz et al. |
| 2008/0029032 A1 | 2/2008 | Sun et al. |
| 2008/0174930 A1 | 7/2008 | Hattori et al. |
| 2008/0264564 A1 | 10/2008 | Sun et al. |
| 2008/0264565 A1 | 10/2008 | Sun et al. |
| 2008/0266746 A1 | 10/2008 | Handa |
| 2008/0268645 A1 | 10/2008 | Kao et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0159588 A1 | 6/2009 | Morioka et al. |
| 2009/0214825 A1 | 8/2009 | Sun et al. |
| 2009/0284894 A1* | 11/2009 | Cooke ................ H01L 21/6831 361/234 |
| 2010/0053841 A1 | 3/2010 | Rusinko, Jr. et al. |
| 2010/0116788 A1 | 5/2010 | Singh et al. |
| 2010/0119843 A1 | 5/2010 | Sun et al. |
| 2010/0177454 A1 | 7/2010 | Elliot et al. |
| 2010/0314356 A1 | 12/2010 | Nagayama et al. |
| 2011/0049729 A1 | 3/2011 | Naundorf et al. |
| 2011/0149462 A1 | 6/2011 | Kugimoto et al. |
| 2011/0174441 A1 | 7/2011 | Yamashita et al. |
| 2012/0034469 A1 | 2/2012 | Sun et al. |
| 2012/0076574 A1 | 3/2012 | Parkhe |
| 2012/0104703 A1 | 5/2012 | Sun et al. |
| 2012/0141661 A1 | 6/2012 | Cho et al. |
| 2012/0299253 A1 | 11/2012 | Kosakai et al. |
| 2012/0307412 A1 | 12/2012 | Boyd, Jr. et al. |
| 2013/0019797 A1 | 1/2013 | Tanaka et al. |
| 2013/0026720 A1 | 1/2013 | Hori et al. |
| 2013/0224675 A1 | 8/2013 | Park |
| 2014/0154465 A1 | 6/2014 | Sun et al. |
| 2014/0159325 A1 | 6/2014 | Parkhe et al. |
| 2014/0203526 A1 | 7/2014 | Banda et al. |

FOREIGN PATENT DOCUMENTS

| | | |
|---|---|---|
| JP | H06-216224 | 8/1994 |
| JP | 2000-306986 | 11/2000 |
| JP | 2001-308075 | 11/2001 |
| JP | 2008-016709 | 1/2008 |
| WO | 90013687 A | 12/1990 |
| WO | 1999/016122 A1 | 4/1999 |
| WO | 2001/024581 | 4/2001 |
| WO | 2003/100843 | 12/2003 |
| WO | 2005/027203 | 3/2005 |

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Haas et al., "Gas jet assisted vapor deposition of yttria stabilized zirconia," Department of Materials Science and Engineering, School of Engineering and Applied Science, published Feb. 27, 2009, University of Virginia, Charlottesville, Virginia 22903.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereo 2011;30:53-62, Published Jan. 27, 2011.

* cited by examiner

SUBSTRATE SUPPORT ASSEMBLY WITH DEPOSITED SURFACE FEATURES

TECHNICAL FIELD

Embodiments of the present invention relate, in general, to a substrate support assembly such as an electrostatic chuck that has a plasma resistant protective layer with deposited surface features.

BACKGROUND

In the semiconductor industry, devices are fabricated by a number of manufacturing processes producing structures of an ever-decreasing size. Some manufacturing processes such as plasma etch and plasma clean processes expose a substrate support such as an electrostatic chuck (ESC) (e.g., an edge of ESC during wafer processing and the full ESC during chamber cleaning) to a high-speed stream of plasma to etch or clean the substrate. The plasma may be highly corrosive, and may corrode processing chambers and other surfaces that are exposed to the plasma.

An ESC typically has surface features that are created by placing a positive mask on a surface of the ESC and then bead blasting exposed portions of the ESC through the positive mask. The positive mask is a mask that contains an exact copy of the pattern which is to remain on the wafer. The bead blasting process causes sharp edges and cracking in the ESC surface. Additionally, the spaces between formed surface features (referred to as valleys) have a high roughness that provides traps that trap particles and peaks that can break during thermal expansion. The trapped particles and broken peaks can cause particle contamination on the backsides of wafers that are held during processing.

SUMMARY

In one embodiment, an electrostatic chuck includes a thermally conductive base and a ceramic body bonded to the thermally conductive base, the ceramic body having an embedded electrode. A protective ceramic coating covers a surface of the ceramic body. Multiple deposited elliptical mesas are distributed over the surface of the ceramic body. The elliptical mesas each have rounded edges.

In one embodiment, a method of manufacturing an electrostatic chuck includes polishing a surface of a ceramic body of the electrostatic chuck to produce a polished surface. The method further includes depositing a protective ceramic coating onto the polished surface of the ceramic body to produce a coated ceramic body. The method further includes disposing a mask over the coated ceramic body, the mask comprising a plurality of elliptical holes (e.g., circular holes). The method further includes depositing a ceramic material through the plurality of elliptical holes of the mask to form a plurality of elliptical mesas on the coated ceramic body, wherein the plurality of elliptical mesas (e.g., circular mesas) have rounded edges. The mask is then removed, and the plurality of elliptical mesas are polished.

In one embodiment, a circular mask for the deposition of elliptical mesas onto a surface of an electrostatic chuck includes a body having a first diameter that is less than a second diameter of the electrostatic chuck onto which the mask is to be placed. The circular mask further includes multiple elliptical through holes in the body, the elliptical through holes having an aspect ratio of approximately 1:2 to approximately 2:1. At least one of the elliptical holes has a flared top end and a flared bottom end, wherein the flared top end is to funnel particles through the elliptical hole onto the electrostatic chuck to form an elliptical mesa on the electrostatic chuck, and wherein the flared bottom end prevents the elliptical mesa from contacting the mask.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
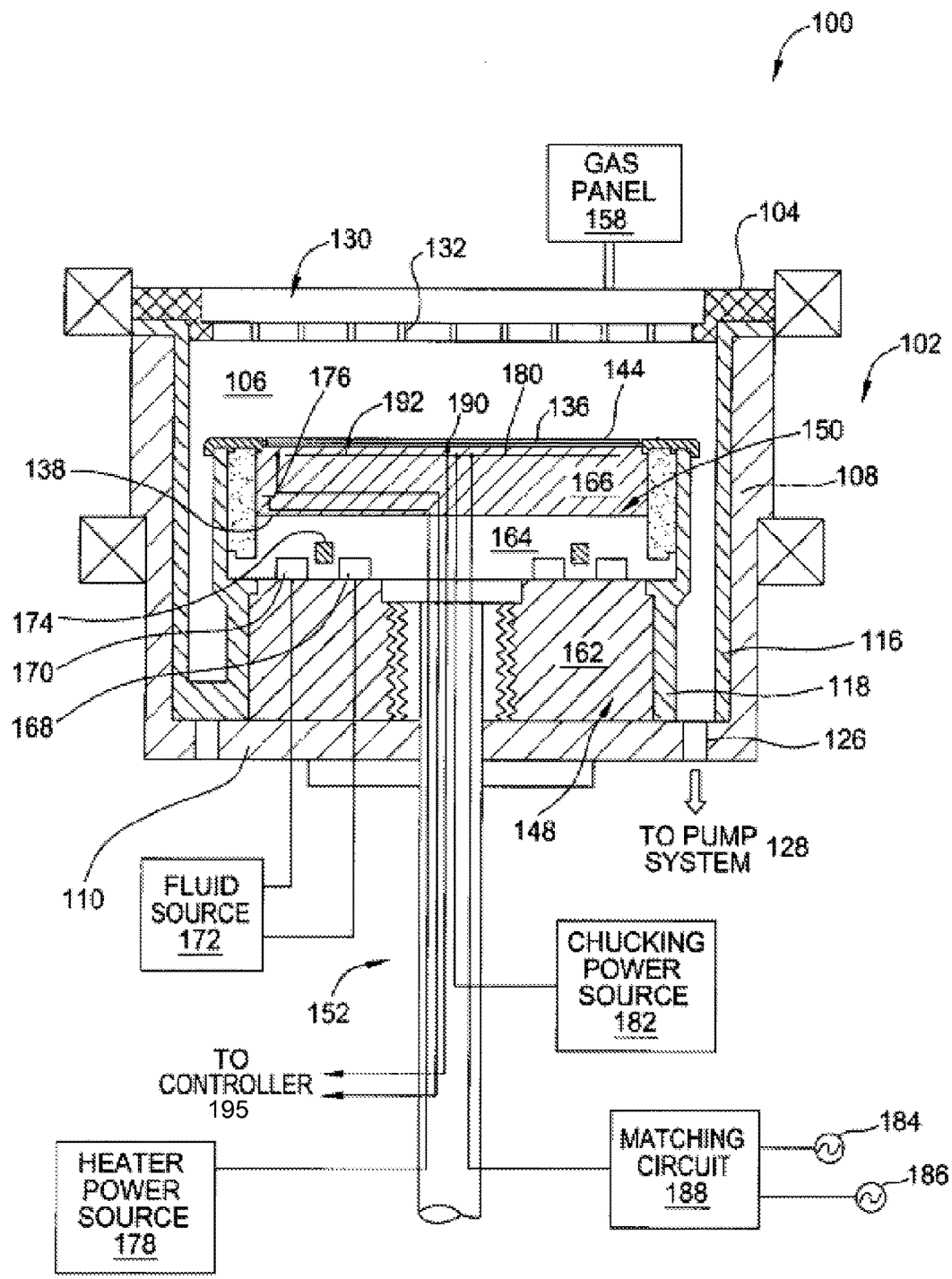
FIG. 1 depicts a sectional side view of one embodiment of a processing chamber.

Embodiments of the present invention provide a substrate support assembly (e.g., an electrostatic chuck) having deposited mesas with rounded edges. Embodiments also provide a substrate support assembly having a protective ceramic coating formed over a ceramic body of the substrate support assembly. The protective ceramic coating may provide plasma corrosion resistance for protection of the ceramic body. The mesas may be deposited over the protective ceramic coating, and may also be resistant to plasma corrosion.

In one embodiment, an electrostatic chuck includes a thermally conductive base (e.g., a metal or metal alloy base) and a ceramic body (e.g., an electrostatic puck) bonded to the thermally conductive base. A protective ceramic coating that acts as a protective layer covers a surface of the ceramic body, and numerous elliptical (e.g., circular) mesas are disposed over the protective ceramic coating. In one embodiment, the electrostatic chuck is manufactured by first depositing the protective ceramic coating on the ceramic body and then depositing the elliptical mesas onto the ceramic body through holes in a mask. As used herein, the term mesa means a protrusion on a substrate that has steep sides and a flat or gently sloped top surface.

Notably, the electrostatic chucks and other substrate supports described in embodiments herein have mesas that are produced by depositing the mesas through a negative mask. The negative mask is a mask that contains an exact opposite of the pattern which is to be formed on the electrostatic chuck. In other words, the negative mask has voids where features are to be formed on the electrostatic chuck. In contrast, mesas are traditionally formed on the surfaces of electrostatic chucks by bead blasting a surface of the electrostatic chuck through a positive mask (a mask that contains an exact copy of a pattern that is to be transferred onto the electrostatic chuck). Mesas formed through the bead blasting process have sharp edges that can chip and cause particle contamination on the backside of wafers supported by the electrostatic chuck. However, mesas that are deposited in accordance with embodiments described herein have rounded edges (e.g., a top-hat profile) that are much less prone to chipping.

Additionally, the bead blasting process traditionally used to produce mesas in electrostatic chucks causes the area (valleys) between the produced mesas to have a high surface roughness. The high surface roughness can act as a trap for particles, which may then be released onto the backside of a supported wafer during processing. Moreover, local peaks in the rough surface of the valleys can crack and break off during thermal cycling. This can act as an additional source of particle contaminants. However, in embodiments described herein a surface of the electrostatic puck is polished prior to deposition of the mesas. Accordingly, the valleys between deposited mesas have a very low surface roughness (e.g., around 4-10 micro-inches), further reducing backside particle contamination.

Electrostatic chucks described in embodiments herein further include a blanket protective ceramic coating that acts as a protective layer for the electrostatic chucks. The protective ceramic coating covers a surface of the electrostatic chuck, and is deposited onto the electrostatic chuck after the surface of the electrostatic chuck is polished. The protective ceramic coating is very conformal, and has approximately the same surface roughness of the polished electrostatic chuck. The protective ceramic coating and the mesas that are deposited on the protective ceramic coating may each be a plasma resistant material such as yttrium aluminum garnet (YAG). Thus, the electrostatic chuck, including the mesas formed on the electrostatic chuck, may be resistant to Chlorine, Fluorine and Hydrogen based plasmas.

FIG. 1 is a sectional view of one embodiment of a semiconductor processing chamber 100 having a substrate support assembly 148 disposed therein. The substrate support assembly 148 includes an electrostatic chuck 150 with an electrostatic puck 166 that has deposited mesas with rounded edges, in accordance with embodiments described herein.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases that may be flowed into the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Notably, the processing gases may be used to generate Chlorine-based plasmas, Fluorine-based plasmas and/or Hydrogen-based plasmas, which may be highly corrosive. The gas distribution assembly 130 may have multiple apertures 132 on the downstream surface of the gas distribution assembly 130 to direct the gas flow to the surface of a substrate 144 (e.g., a wafer) supported by the substrate support assembly 148. Additionally, or alternatively, the gas distribution assembly 130 can have a center hole where gases are fed through a ceramic gas nozzle.

The substrate support assembly 148 is disposed in the interior volume 106 of the processing chamber 100 below the gas distribution assembly 130. The substrate support assembly 148 holds the substrate 144 during processing. An inner liner 118 may be coated on a periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The mounting plate 162 may be coupled to the bottom 110 of the chamber body 102 and includes passages for routing utilities (e.g., fluids, power lines, sensor leads, etc.) to the thermally conductive base 164 and the electrostatic puck 166. In one embodiment, the electrostatic chuck 150 further includes a thermally conductive base 164 bonded to an electrostatic puck 166 by a silicone bond 138.

The electrostatic puck 166 may be a ceramic body that includes one or more clamping electrodes (also referred to as chucking electrodes) 180 controlled by a chucking power source 182. In one embodiment, the electrostatic puck 166 is composed of aluminum nitride (AlN) or aluminum oxide ($Al_2O_3$). The electrostatic puck 166 may alternatively be composed of titanium oxide (TiO), titanium nitride (TiN), silicon carbide (SiC), or the like. The electrode(s) 180 (or other electrode(s) disposed in the electrostatic puck 166) may further be coupled to one or more radio frequency (RF) power sources 184, 186 through a matching circuit 188 for maintaining a plasma formed from process and/or other gases within the processing chamber 100. The one or more RF power sources 184, 186 are generally capable of producing an RF signal having a frequency from about 50 kHz to about 3 GHz and a power of up to about 10,000 Watts.

An upper surface of the electrostatic puck 166 is covered by a protective ceramic coating 136 that is deposited onto the electrostatic puck 166. In one embodiment, the protective ceramic coating is a $Y_3Al_5O_{12}$ (Yttrium Aluminum Garnet, YAG) coating. Alternatively, the protective ceramic coating may be $Al_2O_3$, AlN, $Y_2O_3$ (yttria), or AlON (Aluminum Oxy Nitride). The upper surface of the electrostatic puck 166 further includes multiple mesas and/or other surface features that have been deposited onto the upper surface. The mesas and/or other surface features may have been deposited onto the surface of the electrostatic puck 166 before or after the protective ceramic coating 146 was deposited thereon.

The electrostatic puck 166 further includes one or more gas passages (e.g., holes drilled in the electrostatic puck 166). In operation, a backside gas (e.g., He) may be provided at controlled pressure into the gas passages to enhance heat transfer between the electrostatic puck 166 and the substrate 144.

The thermally conductive base 164 may be a metal base composed of, for example, aluminum or an aluminum alloy. Alternatively, the thermally conductive base 164 may be fabricated by a composite of ceramic, such as an aluminum-silicon alloy infiltrated with SiC to match a thermal expansion coefficient of the ceramic body. The thermally conductive base 164 should provide good strength and durability as well as heat transfer properties. In one embodiment, the thermally conductive base 164 has a thermal conductivity of over 200 Watts per meter Kelvin (W/m K).

The thermally conductive base 164 and/or electrostatic puck 166 may include one or more embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The one or more embedded heating elements 176 may be regulated by a heater power source 178. The conduits 168, 170 and one or more embedded heating elements 176 may be utilized to control a temperature of the thermally conductive base 164, thereby heating and/or cooling the electrostatic puck 166 and the substrate 144 being processed. The temperature of the electrostatic puck 166 and the thermally conductive base 164 may be monitored using a plurality of temperature sensors 190, 192, which may be monitored using a controller 195.

Figure 2A:
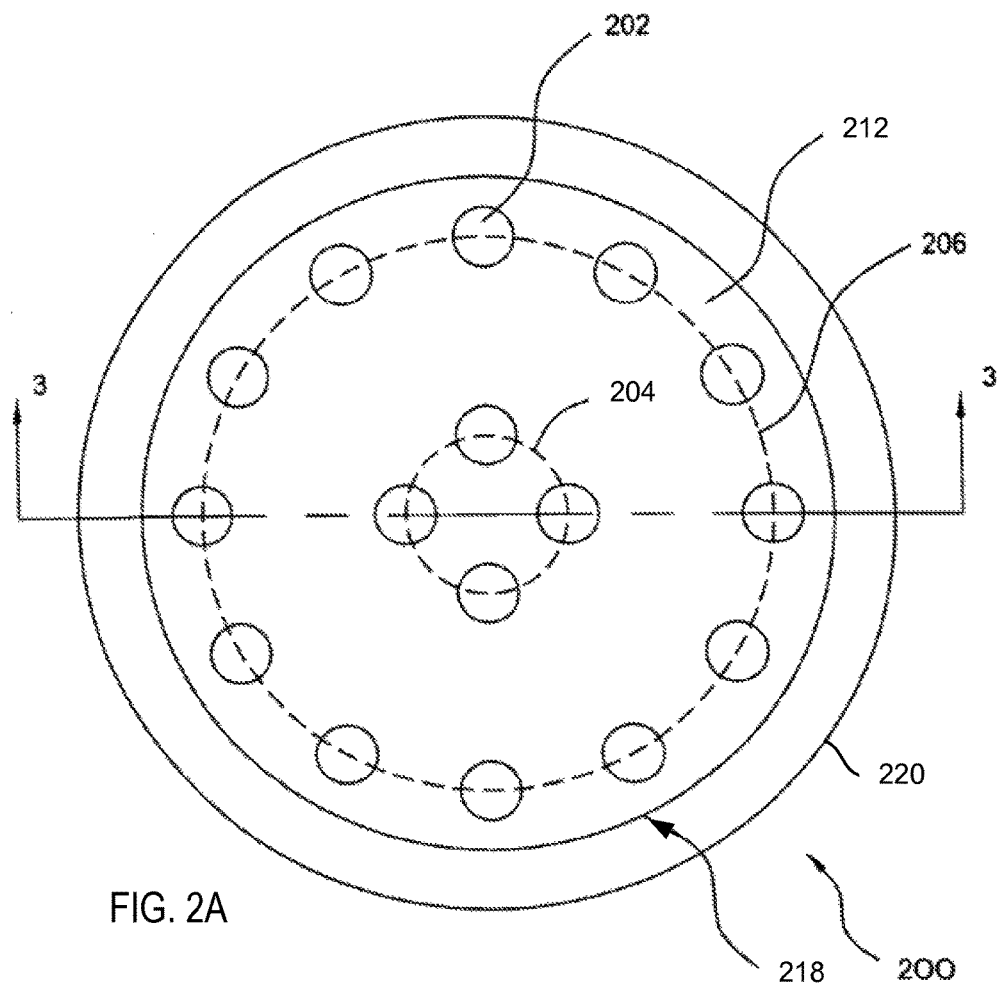
FIG. 2A depicts a top plan view of an example pattern of elliptical mesas on a surface of an electrostatic chuck.
Figure 2B:
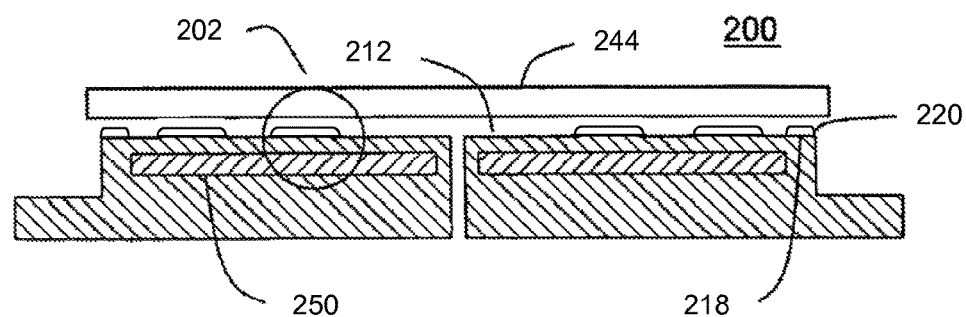
FIG. 2B depicts vertical cross-sectional view of the electrostatic chuck of FIG. 2A.

FIG. 2A depicts a top plan view of an example pattern of elliptical mesas 202 on a surface 212 of an electrostatic puck 200. Only sixteen mesas are shown for illustration purposes. However, the surface of the electrostatic puck 200 may have hundreds or thousands of mesas formed thereon. FIG. 2B depicts vertical cross-sectional view of the electrostatic puck of FIG. 2A taken along a centerline 3-3 of FIG. 2A. The electrostatic puck 200 includes one or more embedded electrodes 250. The electrostatic puck 200 may be an uppermost component of an electrostatic chuck, such as electrostatic chuck 150 of FIG. 1. The electrostatic puck 200 has a disc-like shape having an annular periphery that may substantially match the shape and size of a supported substrate 244 positioned thereon. In one embodiment, the electrostatic puck 200 corresponds to electrostatic puck 166 of FIG. 1.

In the example shown in FIG. 2A, the elliptical mesas 202 are depicted as being positioned along concentric circles 204 and 206 on the surface 212 of the electrostatic puck 200. However, any pattern of mesas 202 distributed over the surface 212 of the electrostatic puck 200 is possible. The elliptical mesas 202 in one embodiment are circular. Alternatively, the elliptical mesas 202 may be oval in shape or have other elliptical shapes.

The mesas 202 are formed as individual pads having a thickness between 2-200 microns (μm) and dimensions in the plan view (e.g., diameters) between 0.5 and 5 mm. In one embodiment, the mesas 202 have a thickness between 2-20 microns and diameters of about 0.5-3 mm. In one embodiment, the mesas 202 have thicknesses of about 3-16 microns and diameters of about 0.5-2 mm. In one embodiment, the mesas have a thickness of about 10 microns and a diameter of about 1 mm. In one embodiment, the mesas have a thickness of about 10-12 microns and a diameter of about 2 mm. In some embodiments, the mesas have a uniform shape and size. Alternatively, various mesas may have different shapes and/or different sizes. Sidewalls of the elliptical mesas 202 may be vertical or sloped. Notably, each of the mesas 202 has rounded edges where the mesas 202 will contact the substrate 244. This may minimize chipping of the mesas 202 and reduce particle contamination on a backside of the substrate 244. Additionally, the rounded edges may reduce or eliminate scratching of the backside of substrate 244 due to chucking. Alternatively, the mesas 202 may have chamfered edges.

Figure 3A:
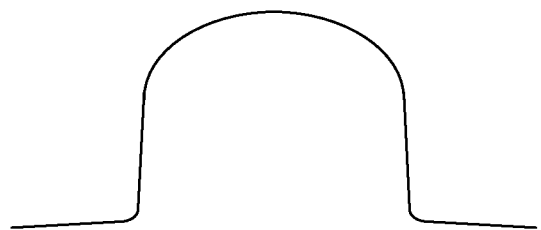
FIGS. 3A-D illustrate side profiles of example mesas, in accordance with embodiments of the present invention.
Figure 3B:
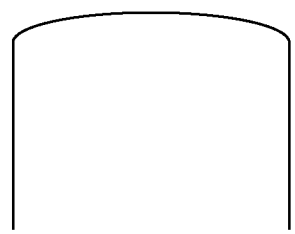
Figure 3C:
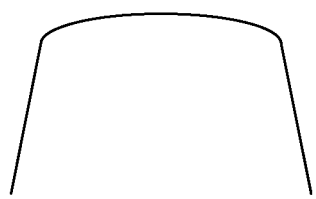
Figure 3D:

Some example side profiles of mesas 220 are illustrated in FIGS. 3A-3D. As shown, in each of the example side profiles of FIGS. 3A-3D the edges of the mesas are rounded. The side profiles of FIGS. 3A-B are variations of a top hat profile.

Referring back to FIGS. 2A-2B, the mesas 202 are deposited mesas that have been formed by a deposition process that forms a dense, conformal ceramic layer, such as ion assisted deposition (IAD). Deposition of the mesas 202 is discussed with reference to FIG. 5. In the illustrated embodiment, the mesas 202 have been deposited directly onto the surface 212 of the electrostatic puck 200 without first depositing a protective ceramic coating on the surface 212. However, a protective ceramic coating may also be deposited before or after deposition of the elliptical mesas 202. An average surface roughness of the mesas 202 may be about 2-12 micro-inches. In one embodiment, an average surface roughness of the mesas 202 is about 4-8 micro-inches.

In one embodiment, the mesas 202 are formed of YAG. In one embodiment, the mesas a composed of an amorphous ceramic including yttrium, aluminum and oxygen (e.g., YAG in an amorphous form). The amorphous ceramic may include at least 8% by weight yttrium. In one embodiment, the amorphous ceramic includes about 8-20% by weight yttrium, 20-32% by weight aluminum and 60-70% by weight oxygen. In one embodiment, the amorphous ceramic includes about 9-10% by weight yttrium, about 25-26% by weight aluminum, and about 65-66% by weight oxygen. In alternative embodiments, the mesas 202 may be $Al_2O_3$, AlN, $Y_2O_3$, or AlON.

The surface 212 of the electrostatic puck 200 further includes a raised lip in the form of a ring 218 at an outer perimeter 220 of the electrostatic puck 200. The ring 218 may have a thickness and a material composition that are the same or approximately the same as the thickness and the material composition of the elliptical mesas 202. The ring 218 may have been formed by deposition at the same time that mesas 202 were formed. The ring 218 may also have rounded edges where the ring 218 contacts the substrate 244. Alternatively, the ring 218 may have chamfered edges, or may have edges that are neither rounded nor chamfered. In one embodiment, an inner edge of the ring 218 is rounded and an outer edge of the ring 218 is not rounded.

Tops of the elliptical mesas 202 and ring 218 contact a backside of supported substrate 244. The elliptical mesas 202 minimize a contact area of the backside of the substrate 244 with the surface 212 of the electrostatic puck 200 and facilitate chucking and de-chucking operations. A gas such as He can also be pumped into an area between the substrate and the electrostatic chuck 200 to facilitate heat transfer between the substrate 244 and the electrostatic chuck 200.

The ring 218 may act as a sealing ring that prevents the gas from escaping the space between the electrostatic chuck 200 and substrate 244.

Figure 4:
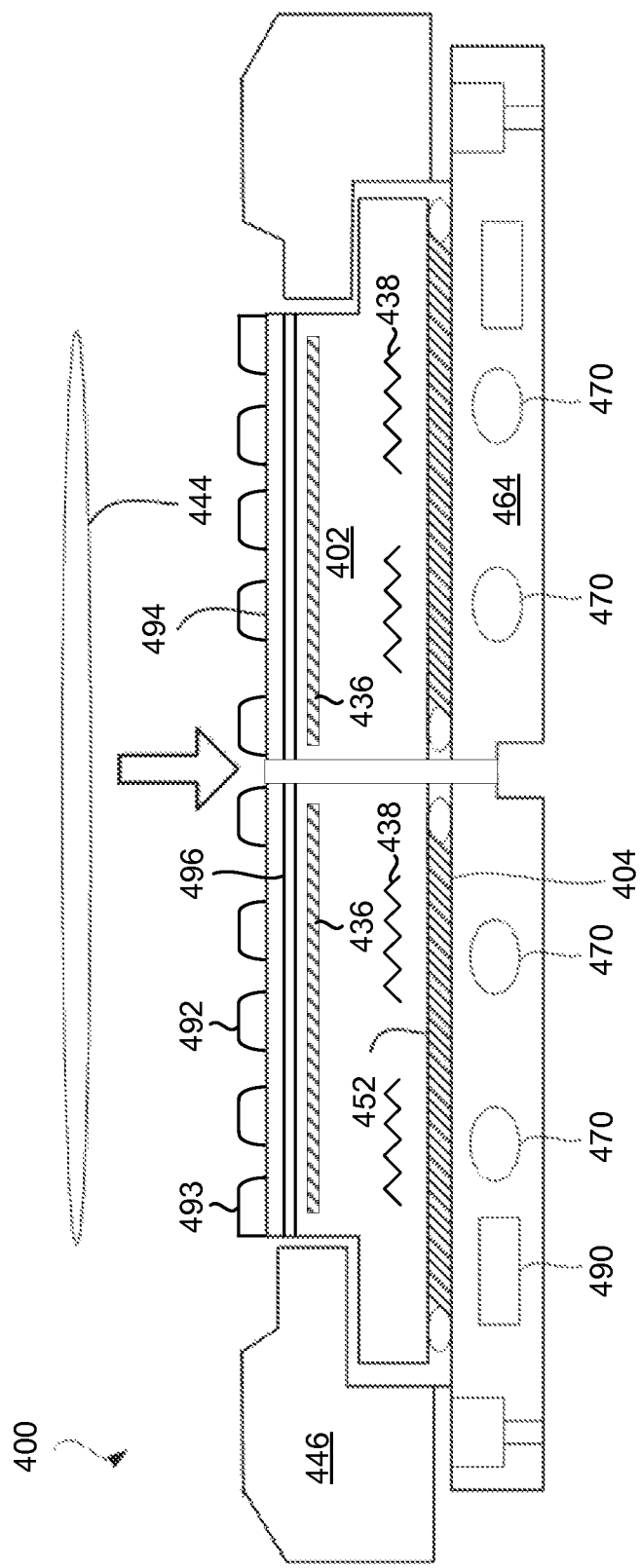
FIG. 4 depicts a sectional side view of one embodiment of an electrostatic chuck.

FIG. 4 illustrates a cross sectional side view of an electrostatic chuck 400, in accordance with one embodiment. The electrostatic chuck 400 includes a thermally conductive base 464 (e.g., a metal base) coupled to an electrostatic puck 402 by a bond 452 such as a silicone bond. The bond 452 may be, for example, a polydimethyl siloxane (PDMS) bond. The electrostatic puck 402 may be a substantially disk shape dielectric ceramic body with one or more embedded electrodes. The electrostatic puck 402 may be a bulk sintered ceramic such as aluminum oxide ($Al_2O_3$), aluminum nitride (AlN), titanium oxide (TiO), titanium nitride (TiN), silicon carbide (SiC) and the like. The electrostatic puck 402 may include one or more embedded electrodes 436 and/or resistive heating elements 438 (e.g., an inner resistive heating element and an outer resistive heating element. A quartz ring 446, or other protective ring, may surround and cover portions of the electrostatic chuck 400. A substrate 444 may be lowered down over the electrostatic chuck 400 and be held in place via electrostatic forces by providing a signal to the one or more electrodes 436.

Thermally conductive base 464 is configured to provide physical support to the electrostatic puck 402. In some embodiments, thermally conductive base 464 is also configured to provide temperature control. Thermally conductive base 464 may be made from a thermally conductive material, for example a metal such as aluminum or stainless steel. Thermally conductive base 464 may comprise one or more heat exchangers, for example, an embedded heating element, fluid channels providing heat exchange by circulating cooling and heating fluids through the channels, or a combination thereof. In FIG. 1, thermally conductive base 464 includes multiple fluid channels also referred to as conduits 470 (e.g., an inner conduit and an outer conduit) through which fluids may be flowed to heat or cool thermally conductive base 464, electrostatic chuck 400, and the substrate 444 through thermal energy exchange between the thermally conductive base 464 and other components of the electrostatic chuck 400 and the substrate 444. The temperature of thermally conductive base 464 may be monitored using a temperature sensor 490.

In one embodiment, the electrostatic chuck 150 additionally includes a ceramic coating 496 that fills in and/or covers defects in a surface of the electrostatic puck 402 such as micro cracks, pores, pinholes, and the like. Ceramic coating 496 may be referred to as a cover ceramic coating or blanket ceramic coating, and may cover an entire surface of the electrostatic puck 402. Alternatively, the electrostatic chuck 150 may not include ceramic coating 496. In one embodiment, the ceramic coating 496 is composed of a same ceramic as the electrostatic puck 402. Accordingly, if the electrostatic puck 402 is AlN, then the cover ceramic coating 496 is also AlN. Alternatively, if the electrostatic puck 402 is $Al_2O_3$, then the ceramic coating 496 is also $Al_2O_3$. Alternatively, the ceramic coating may be composed of a same material as a second ceramic coating 494 (discussed below). In one embodiment, the ceramic coating 496 has a thickness of less than 1 micron up to tens of microns.

The ceramic coating 496 may initially have a thickness of at least 5 microns when deposited to fill pores that may have a depth of up to about 5 microns or more. However, the ceramic coating 496 may be polished down to a thickness 1 micron or less. In some instances, the ceramic coating 496 may be substantially polished away, so that it only remains in the pores of the electrostatic puck 402 that it filled. The ceramic coating 496 may be polished to an average surface roughness (Ra) of 2-12 micro-inches. In one embodiment, the ceramic coating 496 is polished to a surface roughness of about 4-8 micro-inches. If no cover ceramic coating is used, then the surface of the electrostatic puck 402 may be polished to the surface roughness of 2-12 micro-inches.

In one embodiment, the ceramic coating 496 (or electrostatic puck 402) is polished to an average surface roughness of approximately 4-8 micro-inches. Lower surface roughness is desirable to minimize particle contamination and seal grain boundaries. Generally, the lower the surface roughness, the less particle contamination that occurs. Moreover, by sealing grain boundaries in ceramic coating 494 and/or electrostatic puck 402, the ceramic coating 494 and/or electrostatic puck 402 becomes more resistant to corrosion. However, the lower the surface roughness, the greater the number of nucleation sites that are present for subsequent deposition of ceramic coating 494 and/or mesas 492. Moreover, lowering the surface roughness reduces an adhesion strength of subsequent coatings over the electrostatic puck 402. Accordingly, it was unexpectedly discovered that performance degrades when the surface of the ceramic coating 496 and/or electrostatic puck 402 is polished to less than about 4 micro-inches.

Electrostatic chuck 400 additionally includes a ceramic coating 494, which in embodiments is a protective ceramic coating. The ceramic coating 494 may be disposed over ceramic coating 496 or may be disposed over electrostatic puck 402 if no cover ceramic coating was deposited. Ceramic coating 494 protects electrostatic puck 402 from corrosive chemistries, such as hydrogen-based plasmas, chlorine-based plasmas and fluorine-based plasmas. Ceramic coating 494 may have a thickness of a few microns to hundreds of microns.

In one embodiment, the ceramic coating 494 has a thickness of about 5-30 microns. The ceramic coating 494 may be a highly conformal coating, and may have a surface roughness that substantially matches the surface roughness of the ceramic coating 496 and/or electrostatic puck 402. If the ceramic coating 496 was deposited and polished, then the ceramic coating 494 may be substantially free from pores, pinholes, micro-cracks, and so on. The ceramic coating 494 may be $Al_2O_3$, AlN, $Y_2O_3$, $Y_3Al_5O_{12}$ (YAG), and AlON. In one embodiment, the ceramic coating 494 is amorphous YAG having at least 8% by weight yttrium. In one embodiment, the ceramic coating 494 has a Vickers hardness (5 Kgf) of about 9 Giga Pascals (GPa). Additionally, the ceramic coating 494 in one embodiment has a density of around 4.55 g/cm3, a flexural strength of about 280 MPa, a fracture toughness of about 2.0 MPa·m$^{1/2}$, a Youngs Modulus of about 160 MPa, a thermal expansion coefficient of about $8.2 \times 10^{-6}$/K (20–900° C.), a thermal conductivity of about 12.9 W/mK, a volume resistivity of greater than $10^{14}$ $\Omega$·cm at room temperature, and a friction coefficient of approximately 0.2-0.3.

As briefly mentioned above, the structure of the ceramic coating 494 and mesas 492 is at least partially dependent on a roughness of the electrostatic puck 402 and/or ceramic coating 496 due to a number of nucleation sites associated with the roughness. When the surface roughness of the electrostatic puck 402 and/or ceramic coating 496 are below about 3 micro-inches, the surface on which the ceramic coating 494 is deposited has very many nucleation sites. This large number of nucleation sites results in a completely amorphous structure. However, by depositing the ceramic coating 494 onto a surface having a surface roughness of about 4-8 micro-inches, the ceramic coating 494 grows or is deposited as an amorphous structure with many vertical fibers rather than as a purely amorphous structure.

In one embodiment, mesas 492 and a ring 493 are deposited over the ceramic coating 494. In such an embodiment, the mesas 492 may be composed of the same material as the ceramic coating 494. Alternatively, the mesas 492 and ring 493 may be deposited prior to the ceramic coating 494 (and thus may be underneath the ceramic coating 494). In such an embodiment, the mesas 492 and ring 493 may either be the same material as the electrostatic puck 402 or the same material as the ceramic coating 494. The mesas may be around 3-15 microns tall (about 10-15 in one embodiment) and about 0.5-3 mm in diameter in some embodiments.

If the electrostatic chuck 400 is to be refurbished after use, then the thickness of the ceramic coating 494 may be at least 20 microns in embodiments, and around 20-30 microns in one embodiment. To refurbish the electrostatic chuck 400, the mesas 492 may be removed by grinding, and a portion of the ceramic coating 494 may additionally be removed by grinding. The amount of material to be removed during grinding may be dependent on an amount of bow in a surface of the electrostatic chuck 400. For example, if the mesas are 8 microns thick and there is 5 microns of bow in the electrostatic chuck 400, then approximately 15 microns may be removed from the surface of the electrostatic chuck 400 to completely remove the mesas 492 and to remove the 5 micron bow. A thickness of at least 20 microns may ensure that the underlying electrostatic puck 402 is not ground during refurbishment in embodiments. Once the mesas and bow have been removed via grinding, a new ceramic coating may be applied over a remainder of the ceramic coating 494, and new mesas 492 and/or other surface features may be formed over the new ceramic coating as described herein.

Figure 5:
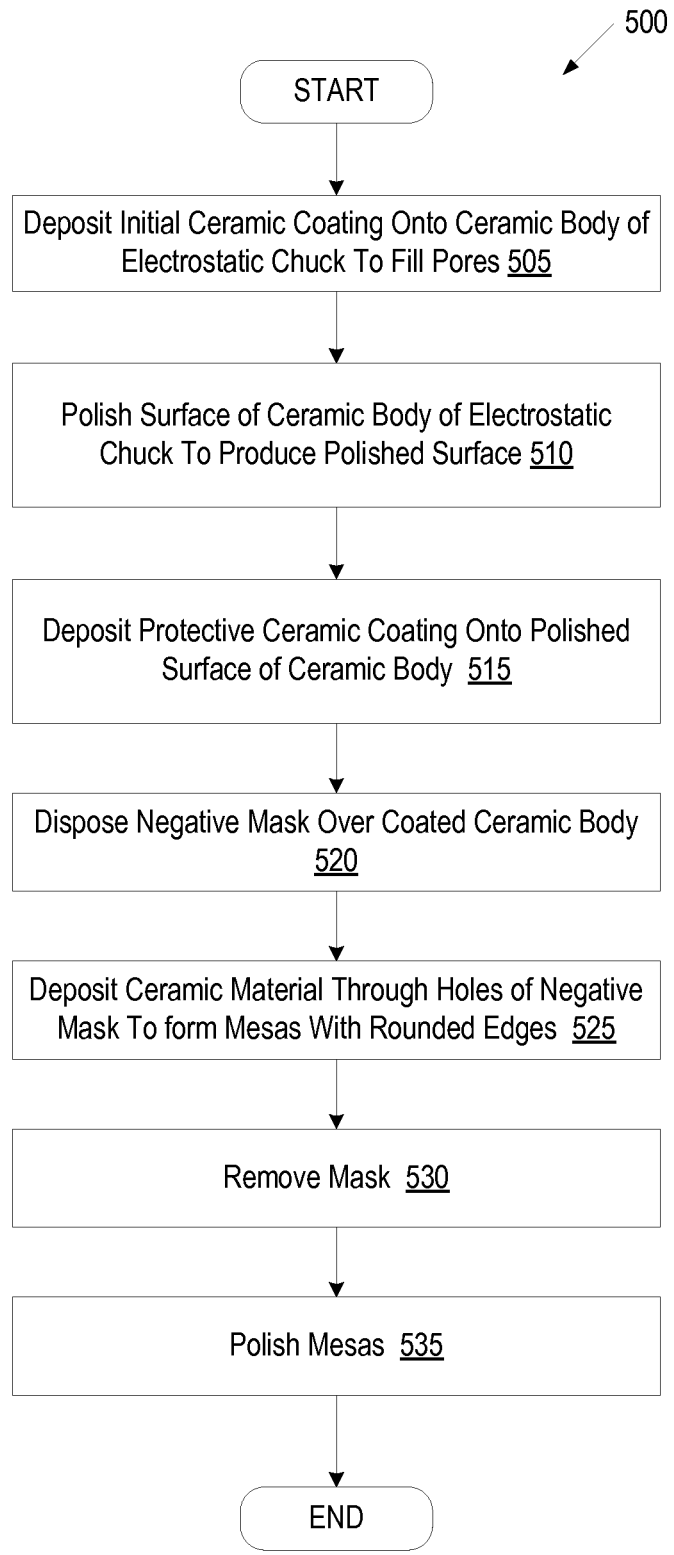
FIG. 5 illustrates one embodiment of a process for manufacturing an electrostatic chuck.

FIG. 5 illustrates one embodiment of a process 500 for manufacturing an electrostatic chuck. Process 500 may be performed to manufacture any of the electrostatic chucks described in embodiments herein, such as electrostatic chuck 400 of FIG. 4. At block 505 of process 500, an initial ceramic coating (referred to as a cover ceramic coating) is deposited onto a ceramic body of an electrostatic chuck to fill in pores, pinholes, micro-cracking, and so on in the ceramic body. The cover ceramic coating may be formed of a same material as the ceramic body. For example, both the ceramic body and the cover ceramic coating may be AlN or $Al_2O_3$. Alternatively, the cover ceramic coating may be formed of a same material as a subsequently deposited protective ceramic coating. For example, both the cover ceramic coating and the protective ceramic coating may be YAG, $Y_2O_3$, $Al_2O_3$, AlN or AlON.

In one embodiment, the cover ceramic coating is deposited via ion assisted deposition (IAD). Exemplary IAD methods include deposition processes which incorporate ion bombardment, such as evaporation (e.g., activated reactive evaporation (ARE)) and sputtering in the presence of ion bombardment to form coatings as described herein. One example IAD process is electron beam IAD (EB-IAD). Other conformal and dense deposition processes that may be used to deposit the cover ceramic coating include low pressure plasma spray (LPPS), plasma spray physical vapor deposition (PS-PVD), and plasma spray chemical vapor deposition (PS-CVD), chemical vapor deposition (CVD), physical vapor deposition (PVD), sputtering, or combinations thereof. Other conformal deposition techniques may also be used.

If IAD is used to deposit the cover ceramic coating, the cover ceramic coating is formed on the ceramic body by an accumulation of deposition materials in the presence of energetic particles such as ions. The deposition materials may include atoms, ions, radicals, and so on. The energetic particles may impinge and compact the thin film protective layer as it is formed. A material source provides a flux of deposition materials while an energetic particle source provides a flux of the energetic particles, both of which impinge upon the ceramic body throughout the IAD process. The energetic particle source may be an oxygen or other ion source. The energetic particle source may also provide other types of energetic particles such as inert radicals, neutron atoms, and nano-sized particles which come from particle generation sources (e.g., from plasma, reactive gases or from the material source that provide the deposition materials).

The material source (e.g., a target body) used to provide the deposition materials may be a bulk sintered ceramic corresponding to the same ceramic that the cover ceramic coating is to be composed of. Other target materials may also be used, such as powders, calcined powders, preformed material (e.g., formed by green body pressing or hot pressing), or a machined body (e.g., fused material).

IAD may utilize one or more plasmas or beams (e.g., electron beams) to provide the material and energetic ion sources. Reactive species may also be provided during deposition of the plasma resistant coating. In one embodiment, the energetic particles include at least one of non-reactive species (e.g., Ar) or reactive species (e.g., O). In further embodiments, reactive species such as CO and halogens (Cl, F, Br, etc.) may also be introduced during the formation of a plasma resistant coating. With IAD processes, the energetic particles may be controlled by the energetic ion (or other particle) source independently of other deposition parameters. According to the energy (e.g., velocity), density and incident angle of the energetic ion flux, composition, structure, crystalline orientation and grain size of the ceramic coating may be manipulated. Additional parameters that may be adjusted are working distance and angle of incidence.

Post coating heat treatment can be used to achieve improved coating properties. For example, it can be used to convert an amorphous coating to a crystalline coating with higher erosion resistance. Another example is to improve the coating to substrate bonding strength by formation of a reaction zone or transition layer.

The IAD deposited cover ceramic coating may have a relatively low film stress (e.g., as compared to a film stress caused by plasma spraying or sputtering). The relatively low film stress may cause the ceramic body to remain very flat, with a curvature of less than about 50 microns over the entire ceramic body for a body with a 12 inch diameter. The IAD deposited cover ceramic coating may additionally have a porosity that is less than 1%, and less than about 0.1% in some embodiments. Therefore, the IAD deposited cover ceramic coating is a dense structure. Additionally, the IAD deposited cover ceramic coating may have a low crack density and a high adhesion to the ceramic body.

The ceramic body may be the electrostatic puck described previously. The ceramic body may have undergone some processing, such as to form an embedded electrode and/or embedded heating elements. A lower surface of the ceramic body may be bonded to a thermally conductive base by a silicone bond. In an alternative embodiment, the operation of block 505 is not performed.

At block 510, a surface of the ceramic body is polished to produce a polished surface having a surface roughness of about 2-12 micro-inches. In one embodiment, the surface of the ceramic body is polished to an average surface roughness (Ra) of about 4-8 micro-inches. The polishing may reduce the initial ceramic coating and/or may almost completely remove the initial ceramic coating except for a portion of the initial ceramic coating that filled in the pores, pinholes, etc.

At block 520, a ceramic coating (e.g., a protective ceramic coating) is deposited or grown onto the polished surface of the ceramic body (e.g., over the initial ceramic coating). In one embodiment, the ceramic coating is YAG, $Y_2O_3$, $Al_2O_3$, AlN or AlON. The ceramic coating may be a conformal coating that may be deposited by any of the deposition techniques discussed with reference to block 505. For example, the ceramic coating may be deposited by performing IAD such as EB-IAD. The ceramic coating may be deposited to a thickness of up to hundreds of microns. In one embodiment, the ceramic coating is deposited to a thickness of approximately 5-30 microns. In one embodiment, the ceramic coating is deposited to a thickness of about 5-10 microns. In one embodiment, the ceramic coating is deposited to a thickness of about 20-30 microns.

At block 520, a negative mask is disposed over the coated ceramic body. The negative mask may be a circular mask with a disk-like shape. The negative mask may have a diameter that is slightly less than a diameter of the ceramic body. The negative mask may additionally include many through holes, where each through hole is a negative of a mesa that is to be formed on the ceramic body. The negative mask is discussed in greater detail below with reference to FIGS. 6A-C and FIG. 7. In one embodiment, the negative mask is bonded to the ceramic body by an adhesive (e.g., is glued to the ceramic body). Alternatively, the negative mask may be held in place over the ceramic body by a mechanical holder.

At block 525, a ceramic material is deposited through the holes of the negative mask to form mesas with rounded edges. Additionally, the ceramic material may be deposited on an exposed portion of the ceramic body at the perimeter of the ceramic body to form a ring thereon. The ring may be formed at the same time as the mesas. The mesas and ring may be conformal and dense, and may be deposited by any of the deposition techniques discussed with reference to block 505 above. For example, the mesas and ring may be deposited using IAD such as EB-IAD.

In one embodiment, the holes in the mask have flared top ends and flared bottom ends. The flared top ends act as a funnel to funnel material into the holes and increase a deposition rate. The flared bottom ends in conjunction with an aspect ratio of the holes (e.g., an aspect ratio of 1:2 to 2:1) may function to control a shape of the deposited mesas and/or the deposited ring. For example, the aspect ratio combined with the flared bottom ends may cause the deposited mesas to have rounded edges and/or a top hat profile. Moreover, the flared bottom ends prevent the mesas from contacting the walls of the holes. This may prevent the mesas from bonding to the mask and bonding the mask to the ceramic body.

In one embodiment, the inner edge of the ring is rounded but the outer edge of the ring is not rounded. This may be because a shape of the negative mask may cause the inner edge of the ring to become rounded during deposition, but there may be no portion of the mask at the outer edge of the ring to control a deposited shape. Alternatively, the edges of the ring may not be rounded.

At block 530, the mask is removed from the ceramic body. At block 535, the mesas and ring are polished. A soft polish process may be performed to polish the mesas. The soft polish may at least partially polish walls of the mesas as well as the tops of the mesas.

In method 500 the protective ceramic coating was deposited prior to deposition of the mesas and ring. However, in alternative embodiments the mesas and ring may be deposited prior to the protective ceramic coating, and the protective ceramic coating may be deposited over the mesas. The protective ceramic coating may be highly conformal, and so the shape of the mesas and ring may be unchanged after deposition of the protective ceramic coating over the mesas and ring.

Figure 6A:
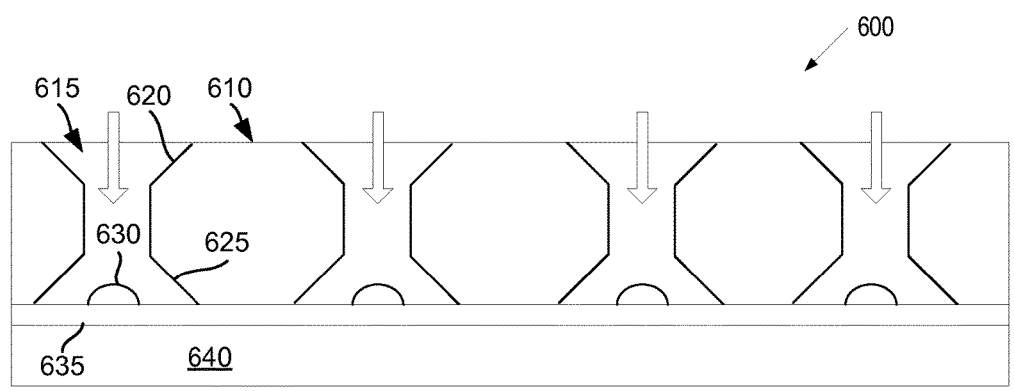
FIGS. 6A-C illustrate the deposition of a ceramic material through a mask to form circular mesas with rounded edges on a surface of an electrostatic chuck.
Figure 6B:
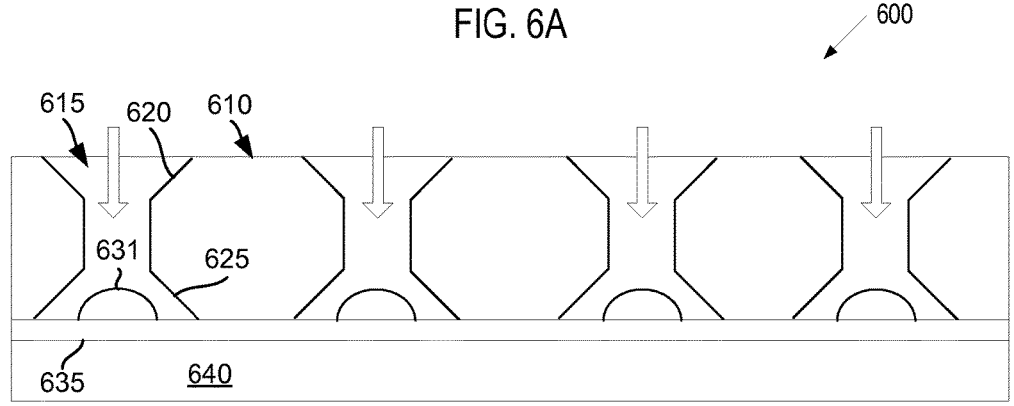
Figure 6C:
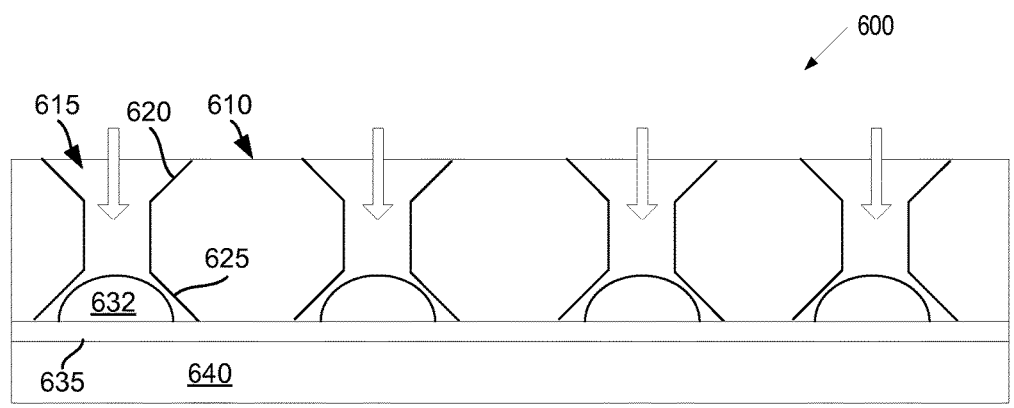

FIGS. 6A-C illustrate the deposition of a ceramic material through a mask 610 to form circular mesas with rounded edges on a surface of an electrostatic chuck 640. The mask 615 includes multiple holes 615. In one embodiment, the mask is approximately 1-3 mm thick. In one embodiment, the mask is approximately 2 mm thick. In one embodiment, the holes are circular holes having a diameter of approximately 0.5-3 mm. In one embodiment, the holes have a diameter of about 0.5-2 mm. In one embodiment, the holes have a diameter of about 1 mm. In one embodiment, the holes are equally sized. Alternatively, the holes may have different diameters. In one embodiment, the holes have an aspect ratio of 1:2 to 2:1 width to height.

As illustrated, in some embodiments the holes have flared top ends 620 and flared bottom ends 625. The flared ends may have a diameter that is approximately 30-70% larger than a diameter of the holes at a narrowest region of the holes (e.g., centered vertically in the hold). In one embodiment, the flared ends have a diameter that is approximately 50% larger than the diameter of the holes at the narrowest region. The top ends and the bottom ends may have flares of the same shape and size. Alternatively, the top ends may have flares of different sizes and/or shapes than the flares at the bottom ends.

The mask 610 is placed over the electrostatic chuck 640, which includes a protective ceramic layer 635 that has been deposited onto a surface of the electrostatic chuck 640. In FIG. 6A, small mesas 630 with rounded edges have been deposited. In FIG. 6B, deposition has continued, and the small mesas 630 have become larger mesas 631 with rounded edges. In FIG. 6C, the deposition has continued to completion, and the mesas 632 have reached their final size. Notably, the mesas 632 do not contact the walls of the holes 615 because of the flared bottom ends 625.

Figure 7:
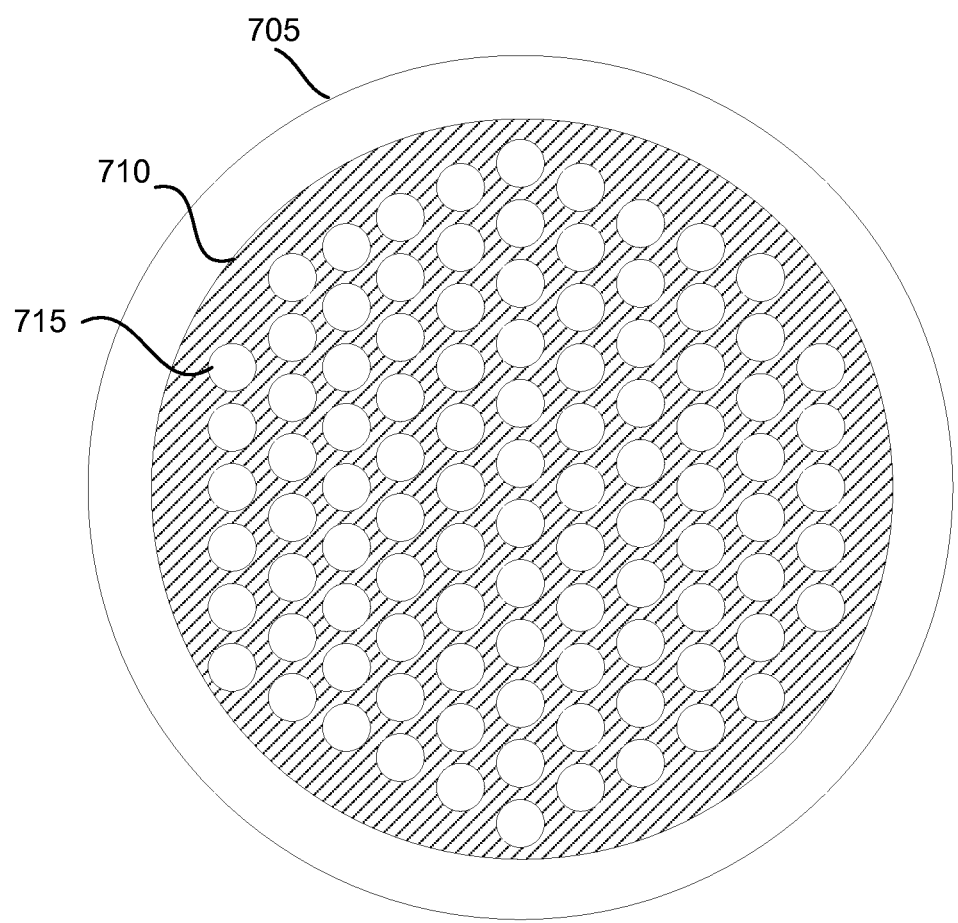
FIG. 7 illustrates a top view of a mask used to form mesas and a ring on a ceramic body of an electrostatic chuck, in accordance with one embodiment.

FIG. 7 illustrates a top view of a mask 710 used to form mesas and a ring on a ceramic body 705 of an electrostatic chuck, in accordance with one embodiment. As shown, the mask 710 is a negative mask that has a first diameter that is less than a second diameter of the ceramic body 705. Accordingly, a deposition process may cause a ring to form at the perimeter of the ceramic body where the ceramic body is not covered by the mask 710. The mask 710 additionally includes many holes 715. The deposition process causes a mesa to form at each of the holes 715.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An electrostatic chuck comprising:
a ceramic body comprising an embedded electrode;
a first ceramic coating on a surface of the ceramic body, wherein the first ceramic coating fills pores in the ceramic body, and wherein the first ceramic coating comprises a same material as the ceramic body;
a second ceramic coating on the first ceramic coating; and
a plurality of elliptical mesas on the second ceramic coating, the plurality of elliptical mesas having rounded edges.

2. The electrostatic chuck of claim 1, wherein:
the ceramic body comprises AlN or $Al_2O_3$;
the second ceramic coating comprises a material from the group consisting of $Al_2O_3$, AlN, $Y_2O_3$, $Y_3Al_5O_{12}$ (YAG), and AlON; and
the plurality of elliptical mesas each comprise the material.

3. The electrostatic chuck of claim 1, wherein the plurality of elliptical mesas comprises a plurality of circular mesas.

4. The electrostatic chuck of claim 3, wherein:
the second ceramic coating has a thickness of about 5-30 microns; and
the plurality of circular mesas have a diameter of about 0.5-2.0 mm and a thickness of about 2-20 microns.

5. The electrostatic chuck of claim 1, wherein the second ceramic coating has an average surface roughness of about 4-10 micro-inches.

6. The electrostatic chuck of claim 1, wherein the second ceramic coating comprises an amorphous ceramic comprising Yttrium, Aluminum and Oxygen, wherein at least 8% of the amorphous ceramic is Yttrium.

7. A method comprising:
polishing a surface of a ceramic body of an electrostatic chuck to produce a polished surface;
depositing a ceramic coating onto the polished surface of the ceramic body to produce a coated ceramic body;
disposing a mask over the coated ceramic body, the mask comprising a plurality of elliptical holes;
depositing a ceramic material through the plurality of elliptical holes of the mask to form a plurality of elliptical mesas on the coated ceramic body, wherein the plurality of elliptical mesas have rounded edges;
removing the mask from the coated ceramic body; and
polishing the plurality of elliptical mesas.

8. The method of claim 7, further comprising:
depositing an initial ceramic coating onto the ceramic body prior to polishing the surface of the ceramic body, wherein the initial ceramic coating fills pores in the ceramic body.

9. The method of claim 8, wherein the initial ceramic coating comprises a same material as the ceramic body.

10. The method of claim 7, wherein:
the ceramic body comprises AlN or $Al_2O_3$;
the ceramic coating comprises a material from the group consisting of $Al_2O_3$, AlN, $Y_2O_3$, $Y_3Al_5O_{12}$ (YAG), and AlON; and
the plurality of elliptical mesas each comprise the material.

11. The method of claim 7, wherein the ceramic coating comprises an amorphous ceramic comprising Yttrium, Aluminum and Oxygen, wherein at least 8% of the amorphous ceramic is Yttrium.

12. The method of claim 7, wherein the plurality of elliptical holes in the mask are a plurality of circular holes that are flared at a top end and a bottom end.

13. The method of claim 12, wherein the plurality of elliptical mesas are a plurality of circular mesas having a diameter of about 0.5-2.0 mm and a thickness of about 2-20 microns.

14. The method of claim 7, wherein polishing the surface of the ceramic body comprises polishing the surface to an average surface roughness of about 4-10 micro-inches.

15. The method of claim 7, wherein disposing the mask over the coated ceramic body comprises bonding the mask to the coated ceramic body using an adhesive.

16. The method of claim 7, wherein depositing the ceramic coating onto the polished surface comprises depositing the ceramic coating to a thickness of about 5-30 microns.

17. A circular mask comprising:
a body having a first diameter that is less than a second diameter of an electrostatic chuck onto which the mask is to be placed; and
a plurality of elliptical through holes in the body, the plurality of elliptical through holes having an aspect ratio of approximately 1:2 to approximately 2:1, wherein at least one elliptical hole of the plurality of elliptical through holes comprises a flared top end and a flared bottom end, wherein the flared top end is to funnel particles through the at least one elliptical hole onto the electrostatic chuck to form an elliptical mesa on the electrostatic chuck, wherein the flared bottom end prevents the elliptical mesa from contacting the mask.

18. The circular mask of claim 17, wherein the at least one elliptical hole is a circular hole having a diameter of approximately 0.5-2.0 mm and a thickness of approximately 1-3 mm.

19. The circular mask of claim 17, wherein the flared top end and the flared bottom end each have a first diameter that is approximately 20-70% greater than a second diameter at a narrowest region of the at least one elliptical hole.

* * * * *